(12) United States Patent
Wang

(10) Patent No.: US 9,425,223 B1
(45) Date of Patent: Aug. 23, 2016

(54) MANUFACTURE METHOD OF TFT SUBSTRATE AND STURCTURE THEREOF

(71) Applicant: Shenzhen China Star Optoelectronics Technology Co., Ltd., Shenzhen, Guangdong (CN)

(72) Inventor: Jun Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 62 days.

(21) Appl. No.: 14/427,628

(22) PCT Filed: Sep. 11, 2014

(86) PCT No.: PCT/CN2014/086257
§ 371 (c)(1),
(2) Date: Mar. 11, 2015

(87) PCT Pub. No.: WO2016/026176
PCT Pub. Date: Feb. 25, 2016

(30) Foreign Application Priority Data

Aug. 20, 2014 (CN) .......................... 2014 1 0415799

(51) Int. Cl.
*H01L 29/10* (2006.01)
*H01L 27/12* (2006.01)
*H01L 21/44* (2006.01)
*H01L 29/66* (2006.01)
*H01L 29/786* (2006.01)
*H01L 27/32* (2006.01)

(52) U.S. Cl.
CPC ............ *H01L 27/1288* (2013.01); *H01L 21/44* (2013.01); *H01L 29/66969* (2013.01); *H01L 29/7869* (2013.01); *H01L 27/3244* (2013.01)

(58) Field of Classification Search
CPC ............ H01L 27/1288; H01L 27/1248; H01L 27/124; H01L 27/14601; H01L 27/3244; H01L 29/66969; H01L 29/7869
See application file for complete search history.

(56) References Cited

U.S. PATENT DOCUMENTS

| 8,461,582 B2* | 6/2013 | Kimura | H01L 27/1214 257/347 |
| 2014/0147966 A1* | 5/2014 | Nakagawa | G02F 1/136227 438/104 |
| 2014/0307195 A1* | 10/2014 | Nakazawa | G02F 1/136213 349/43 |
| 2016/0056267 A1* | 2/2016 | Wang | H01L 29/66742 257/43 |

* cited by examiner

Primary Examiner — Yosef Gebreyesus
(74) Attorney, Agent, or Firm — Andrew C. Cheng

(57) ABSTRACT

The present invention provides a manufacture method of a TFT substrate, and the method comprises steps of: 1, depositing a first metal layer (2) on a substrate (1); 2, coating a first photoresistor layer (3) and implementing gray scal exposure; 3, removing a part of the first metal layer (2) to form a gate (21) and a source/a drain (23); 4, implementing ashing process to the first photoresistor layer (3); 5, depositing an isolation layer (4); 6, removing a part of the first photoresistor area (3) and a part of the isolation layer (4); 7, forming an oxide semiconductor layer (5); 8, depositing a protecting layer (6); 9, coating a second photoresistor layer (7) and implementing gray scal exposure; 10, removing a part of the protecting layer (6); 11, implementing ashing process to the second photoresistor layer (7); 12, depositing a transparent conducting thin film (8); 13, removing a part of second photoresistor layer (7) and a part of the transparent conducting thin film (8); 14, forming a pixel definition layer (9); 15, forming photo spacers (10).

11 Claims, 7 Drawing Sheets

MANUFACTURE METHOD OF TFT SUBSTRATE AND STURCTURE THEREOF

FIELD OF THE INVENTION

The present invention relates to a display technology field, and more particularly to a manufacture method of a TFT substrate and a structure thereof.

BACKGROUND OF THE INVENTION

A flat panel display possesses advantages of being ultra thin, power saved and radiation free and has been widely utilized. Present flat panel displays mainly comprise a LCD (Liquid Crystal Display) or an OLED (Organic Light Emitting Display).

To be compared with a well developed TFT-LCD, an OLED based on the Organic Light Emitting Diodes is an active light emitting display, which possesses outstanding properties of self-illumination, high contrast, wide view angle (up to 170°), fast response, high luminous efficiency, low operation voltage (3-10V), ultra-thin (thickness smaller than 2 mm) and etc. The display devices utilizing OLED technology has possibility to have a lighter, thinner, charming appearance, more excellent color display quality, wider view range and greater design flexibility. The more important thing is that the environmental suitability of the OLED is far superior to the liquid crystal display. The tolerant temperature range can be −40-85° C. and the OLED is lead free and does not pollute the environment. Therefore, the OLED display must have become the only choice of the display technology of next generation.

According to the driving modes, the OLED can be categorized as PM-OLED (Passive matrix OLED) and AM-OLED (Active matrix OLED).

During the manufacture of the AM-OLED, the manufacture of diode driving elements is one of the key skills. Because the oxide semiconductor has higher electron mobility and the oxide semiconductor process is considered to be much simple than that of low temperature poly silicon (LTPS) which is also more compatible with the amorphous silicon process and meets the requirement of the new generation production lines for wide applications.

Generally, the present TFT substrate structure of an AM-OLED comprises a substrate, a gate, a gate isolation layer, an oxide semiconductor layer, an etching stopper layer, a source/a drain, a protecting layer, a flat layer, a pixel electrode, a pixel definition layer, photo spacers and etc. In the manufacture procedures, the formation of each layer structure requires one photolithography process and each photolithography process comprises processes of film formation, lithography, etching, stripping and etc. The lithography process further comprises processes of photoresistor coating, exposure and development and each lithography process requires creating one mask. The process becomes verbose, the manufacture skill is complicated and the production efficiency is lower; the more amount of masks is required, the higher the production cost became; meanwhile, the more the processes are involved, and the accumulated yield issue gets more significant.

SUMMARY OF THE INVENTION

An objective of the present invention is to provide a manufacture method of a TFT substrate capable of simplifying and shortening the process procedure, raising the manufacture efficiency, reducing the amount of masks and the manufacture cost and raising the yield of products.

Another objective of the present invention is to provide a TFT substrate structure, which the process procedure is shorter, the manufacture efficiency is higher and the manufacture cost is lower.

For realizing the aforesaid objective, the present invention provides a manufacture method of a TFT substrate, comprising steps of:

step 1, providing a substrate and deposing a first metal layer on the substrate;

step 2, coating a first photoresistor layer on the first metal layer, and implementing gray scal exposure to the first photoresistor layer by a first mask process for patterning the first photoresistor layer to form a first photoresistor area, a second photoresistor area and a third photoresistor area spaced with one another;

step 3, removing the first metal layer uncovered by the first, the second and the third photoresistor areas to form a gate and a source/a drain;

step 4, implementing ashing process to the first, the second and the third photoresistor areas to reserve a part of the first photoresistor area, a part of the second photoresistor area; removing the third photoresistor area;

the part of the first photoresistor area and the part of the second photoresistor area respectively correspond to a first, a second and a third vias of an isolation layer to be formed;

step 5, deposing the isolation layer on the substrate, the gate, the source/the drain, the part of the first photoresistor area and the part of the second photoresistor area;

step 6, removing the part of the first photoresistor area, the part of the second photoresistor area and the isolation layer deposed on the both to form the first, the second and the third vias for exposing the gate and the source/the drain;

step 7, deposing an oxide semiconductor thin film on the isolation layer, and a second mask to implement a photolithography process, and implementing etching, patterning and anneal processes to the oxide semiconductor thin film to form an oxide semiconductor layer;

the oxide semiconductor layer partially fills the first, the second vias, and contacts the source/the drain to form electrical connections;

step 8, deposing a protecting layer on the oxide semiconductor layer and the isolation layer;

step 9, coating a second photoresistor layer on the protecting layer, and implementing gray scal exposure to the second photoresistor layer by a third mask process for patterning the second photoresistor layer to form a fourth photoresistor area, a fifth photoresistor area, a sixth photoresistor area and a seventh photoresistor area spaced with one another;

step 10, removing the protecting layer uncovered by the fourth photoresistor area, the fifth photoresistor area, the sixth photoresistor area and the seventh photoresistor area to form a first, a second and a third through holes for exposing the gate and the source/the drain;

step 11, implementing ashing process to the second photoresistor layer to reserve a part of the fourth photoresistor area and a part of the fifth fourth photoresistor area; removing the sixth photoresistor area and the seventh photoresistor area;

step 12, deposing a transparent conducting thin film on the part of the fourth photoresistor area, the part of the fifth fourth photoresistor area, the protecting layer, the gate, the source/the drain, and a part of the transparent conducting thin film is employed as a landing electrode to fill the second and the third through holes for connecting the gate and the source/the drain, and a part of the transparent conducting thin film is employed as a pixel electrode to fill the first through hole and connect the source/the drain;

step 13, removing the part of the fourth photoresistor area, the part of the fifth fourth photoresistor area and the transparent conducting thin film deposed on the both, and implementing anneal process;

step 14, coating photoresist on the transparent conducting thin film and the protecting layer, and implementing exposure and development by a fourth mask to define illuminating display positions and form a pixel definition layer;

step 15, coating photoresist on the pixel definition layer, and implementing exposure and development by a fifth mask to form photo spacers.

In the step 2, the first photoresistor area comprises a central part and side parts at two sides of the central part, and a thickness of the central part is larger than a thickness of the two side parts, and a width a first photoresistor area is larger than widths of the second, the third photoresistor areas, and the thickness of the central part and the thickness of the second photoresistor area are larger than the thickness of the third photoresistor area;

the ashing process in the step 4 comprises removing the two side parts of the first photoresistor area and diminishing the thickness of the central part, and reserving a part of the first photoresistor area; diminishing the thickness of the second photoresistor area, and reserving a part of the second photoresistor area; removing the third photoresistor area.

Thickness differences among the part of the first photoresistor area, the part of the second photoresistor area and the gate, the source/the drain are utilized in the step 6 to remove the part of the first photoresistor area, the part of the second photoresistor area and the isolation layer deposed on the both by lift-off process.

In the step 7, the oxide semiconductor layer is an IGZO oxide semiconductor layer.

In the step 9, the fourth photoresistor area comprises a main part and an extruding part, and a thickness of the extruding part is larger than a thickness of the main part, and the thicknesses of the extruding part and the fifth photoresistor area are larger than thicknesses of the sixth photoresistor area and the seventh photoresistor area;

the ashing process in the step 11 comprises removing the main part of the fourth photoresistor area and diminishing the thickness of extruding part, and reserving a part of the fourth photoresistor area; diminishing the thickness of the fifth photoresistor area, and reserving a part of the fifth photoresistor area; removing the sixth photoresistor area and the seventh photoresistor area.

In the step 12, the transparent conducting thin film is an ITO transparent conducting thin film or an IZO transparent conducting thin film.

Thickness differences among the part of the fourth photoresistor area, the part of the fifth photoresistor area and the protecting layer are utilized in the step 13 to remove the part of the fourth photoresistor area, the part of the fifth photoresistor area and the transparent conducting thin film deposed on the both by lift-off process.

In the step 14, the step 15, material of the pixel definition layer, the photo spacer is organic photoresistor.

The present invention further provides a TFT substrate structure manufactured by the manufacture method of the TFT substrate, comprising a substrate, a gate on the substrate, a source/a drain on the substrate, an isolation layer on the substrate, the gate and the source/the drain, an oxide semiconductor layer on the isolation layer, a protecting layer on the isolation layer and the oxide semiconductor layer, a transparent conducting thin film on the protecting layer, a pixel definition layer on the transparent conducting thin film and the protecting layer and photo spacers on the pixel definition layer; the gate and the source/the drain are located with in-between spaces, and the isolation layer comprises a first, a second and a third vias, and the protecting layer correspondingly comprises a first, a second and a third through holes for exposing the gate and the source/the drain, and the oxide semiconductor layer fills a part of the first and the second vias, and contacts the source/the drain to form electrical connections; the transparent conducting thin film comprises a landing electrode and a pixel electrode, and the landing electrode fills the second and the third through holes for connecting the gate and the source/the drain, and the pixel electrode fills the first through hole and connects the source/the drain.

Material of the oxide semiconductor layer is IGZO, and material of the transparent conducting thin film is ITO or IZO, and material of the pixel definition layer and the photo spacer is organic photoresistor.

The benefits of the present invention are: according to the manufacture method of the TFT substrate of the present invention, the gate and the source/the drain are formed with the first metal layer. The connections thereof are achieved with the transparent conducting thin film and the TFT substrate structure is simplified; the gray scal exposure skill is employed to implement exposure to the photoresistor, and the manufacture of the TFT substrate is accomplished by five masks. The process procedure is shortened. The manufacture efficiency is raised. The amount of the masks is reduced. The manufacture cost is decreased. The yield of products can be raised. According to the TFT substrate structure, the gate and the source/the drain are formed on the substrate. The connections thereof are achieved with the transparent conducting thin film. It is capable of shortening the process procedure, raising the manufacture efficiency and reducing the manufacture cost.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Figure 1:
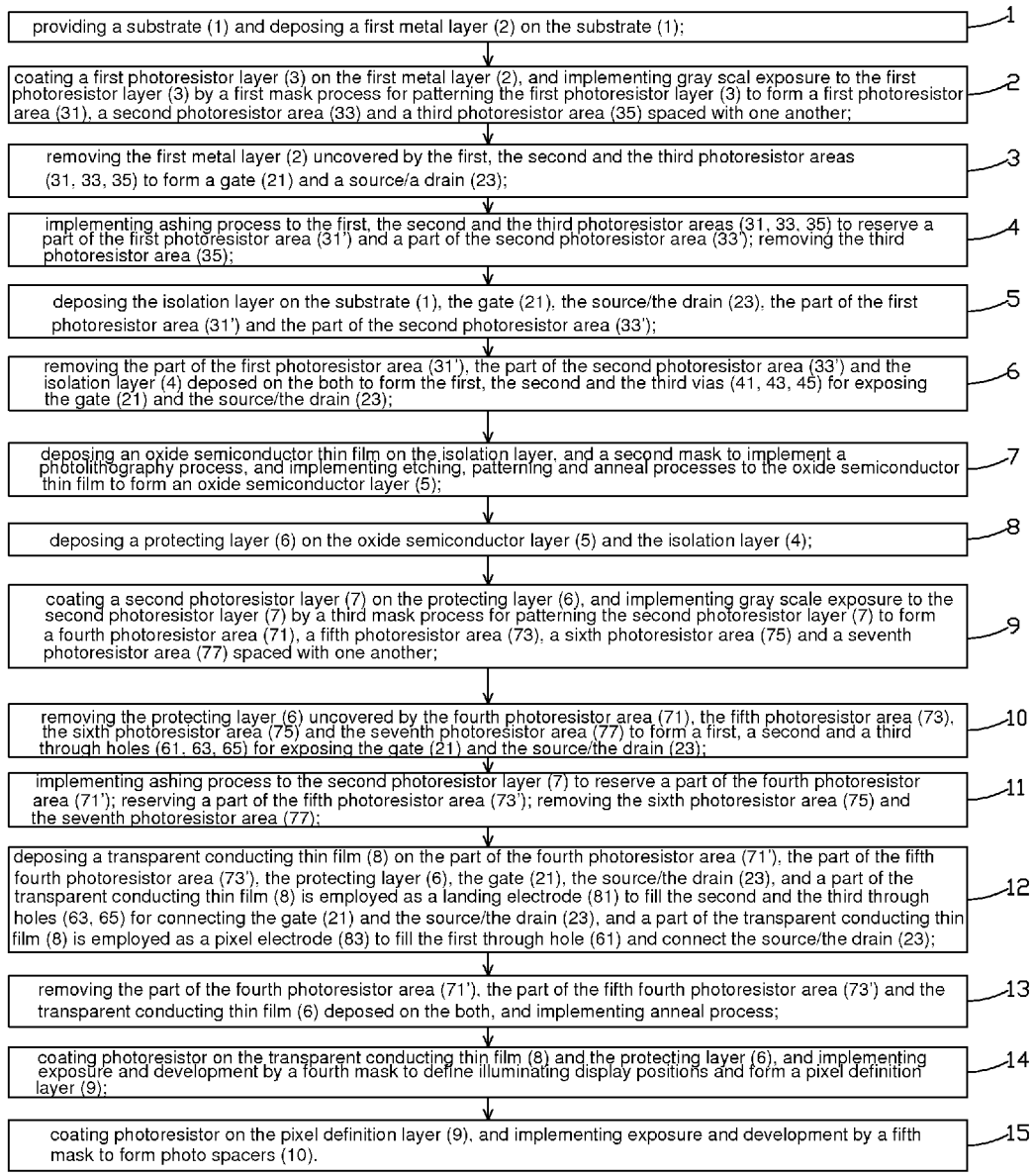
FIG. 1 is a flowchart of a manufacture method of a TFT substrate according to the present invention.
Figure 2:
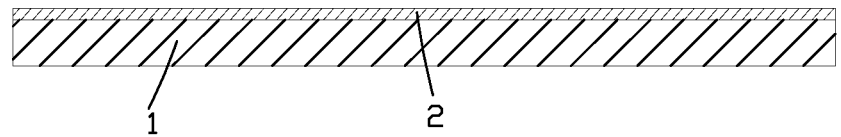
FIG. 2 is a diagram of step 1 in the manufacture method of the TFT substrate according to the present invention.

Please refer to FIG. 1, which is a flowchart of a manufacture method of a TFT substrate according to the present invention, comprising steps of:

step 1, as shown in FIG. 2, providing a substrate 1 and deposing a first metal layer 2 on the substrate 1.

Figure 3:
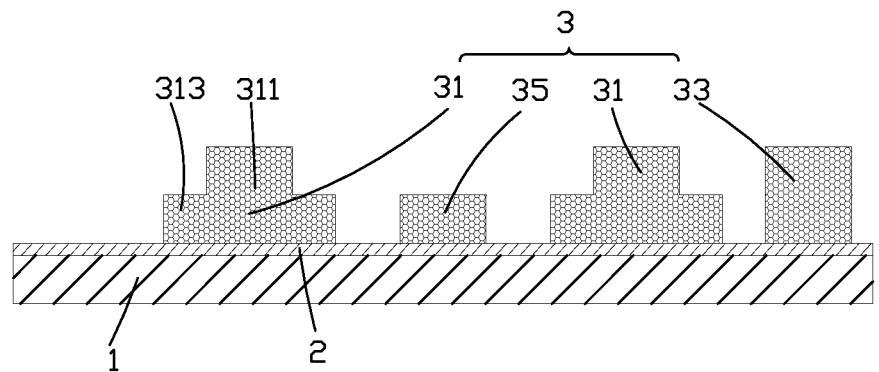
FIG. 3 is a diagram of step 2 in the manufacture method of the TFT substrate according to the present invention.

The substrate 1 is a transparent substrate. Preferably, the substrate 1 is a glass substrate.

step 2, as shown in FIG. 3, coating a first photoresistor layer 3 on the first metal layer 2, and implementing gray scal exposure to the first photoresistor layer 3 by a first mask process for patterning the first photoresistor layer 3 to form a first photoresistor area 31, a second photoresistor area 33 and a third photoresistor area 35 spaced with one another.

Figure 4:
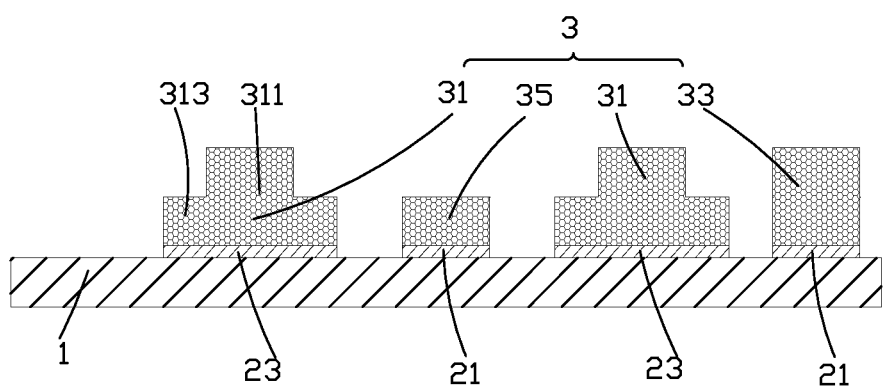
FIG. 4 is a diagram of step 3 in the manufacture method of the TFT substrate according to the present invention.

Specifically, the first photoresistor area 31 comprises a central part 311 and side parts 313 at two sides of the central part 311, and a thickness of the central part 311 is larger than a thickness of the two side parts 313, and a width a first photoresistor area 31 is larger than widths of the second, the third photoresistor areas 33, 35, and the thickness of the central part 311 and the thickness of the second photoresistor area 33 are larger than the thickness of the third photoresistor area 35.

step 3, as shown in FIG. 4, removing the first metal layer 2 uncovered by the first, the second and the third photoresistor areas 31, 33, 35 to form a gate 21 and a source/a drain 23.

Figure 5:
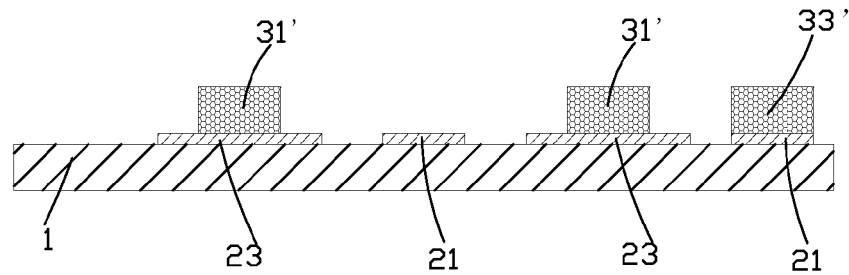
FIG. 5 is a diagram of step 4 in the manufacture method of the TFT substrate according to the present invention.

Hence, the gate 21 and the source/the drain 23 are formed with the first metal layer 2 and located on the substrate 1 with spaces.

step 4, as shown in FIG. 5, implementing ashing process to the first, the second and the third photoresistor areas 31, 33, 35 with injecting oxygen gas to remove the two side parts 313 of the first photoresistor area 31, and diminishing the thickness of the central part 311 and reserve a part of the first photoresistor area 31'; diminishing the thickness of the second photoresistor area 33 and reserving a part of the second photoresistor area 33'; removing the third photoresistor area 35.

Figure 6:
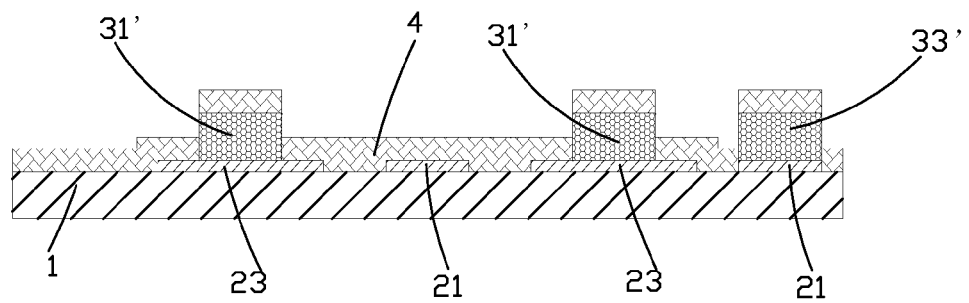
FIG. 6 is a diagram of step 5 in the manufacture method of the TFT substrate according to the present invention.
Figure 7:
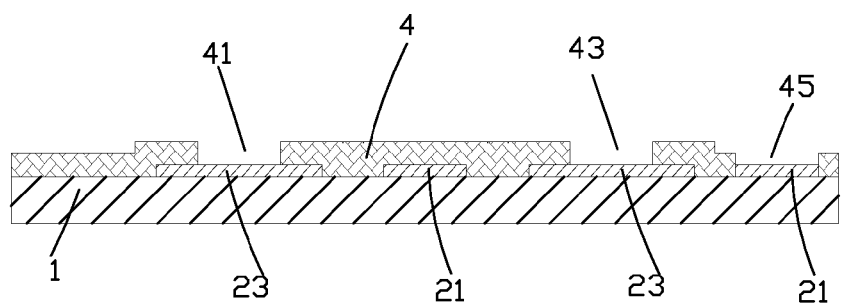
FIG. 7 is a diagram of step 6 in the manufacture method of the TFT substrate according to the present invention.
Figure 8:
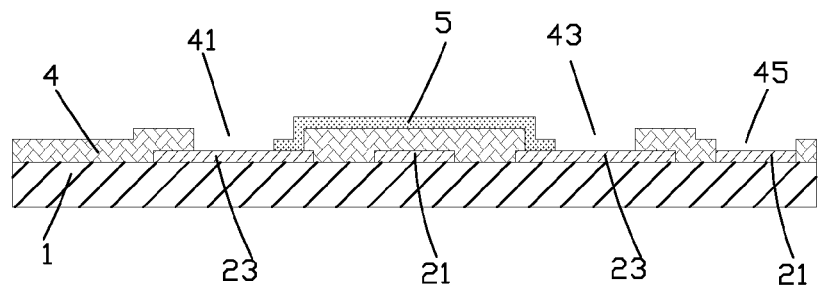
FIG. 8 is a diagram of step 7 in the manufacture method of the TFT substrate according to the present invention.

The part of the first photoresistor area 31' and the part of the second photoresistor area 33' respectively correspond to a first, a second and a third vias 41, 43, 45 of an isolation layer 4 to be formed.

step 5, as shown in FIG. 6, deposing the isolation layer on the substrate 1, the gate 21, the source/the drain 23, the part of the first photoresistor area 31' and the part of the second photoresistor area 33'.

step 6, as shown in FIG. 7, by utilizing the thickness differences among the part of the first photoresistor area 31', the part of the second photoresistor area 33' and the gate 21, the source/the drain 23, removing the part of the first photoresistor area 31', the part of the second photoresistor area 33' and the isolation layer 4 deposed on the both to form the first, the second and the third vias 41, 43, 45 for exposing the gate 21 and the source/the drain 23 by lift-off process.

step 7, as shown in FIG. 8, deposing an oxide semiconductor thin film on the isolation layer 4, and a second mask to implement a photolithography process, and implementing etching, patterning and anneal processes to the oxide semiconductor thin film to form an oxide semiconductor layer 5.

Specifically, the oxide semiconductor layer 5 is an Indium gallium zinc oxide (IGZO) oxide semiconductor layer.

Figure 9:
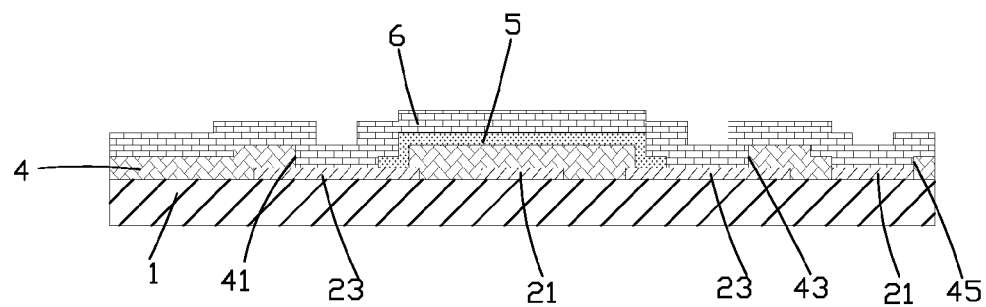
FIG. 9 is a diagram of step 8 in the manufacture method of the TFT substrate according to the present invention.
Figure 10:
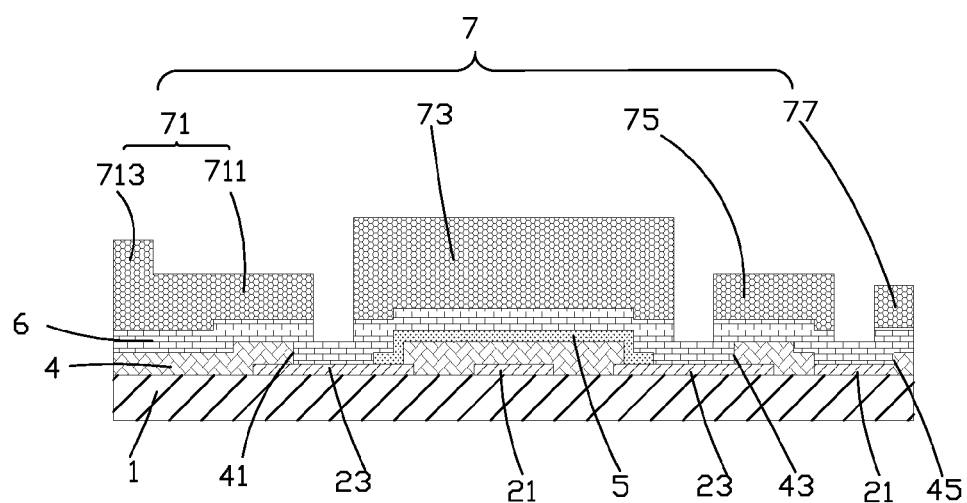
FIG. 10 is a diagram of step 9 in the manufacture method of the TFT substrate according to the present invention.

The oxide semiconductor layer 5 partially fills the first, the second vias 41, 43, and contacts the source/the drain 23 to form electrical connections.

step 8, as shown in FIG. 9, deposing a protecting layer 6 on the oxide semiconductor layer 5 and the isolation layer 4.

step 9, as shown in FIG. 10, coating a second photoresistor layer 7 on the protecting layer 6, and implementing gray scal exposure to the second photoresistor layer 7 by a third mask process for patterning the second photoresistor layer 7 to form a fourth photoresistor area 71, a fifth photoresistor area 73, a sixth photoresistor area 75 and a seventh photoresistor area 77 spaced with one another.

Figure 11:
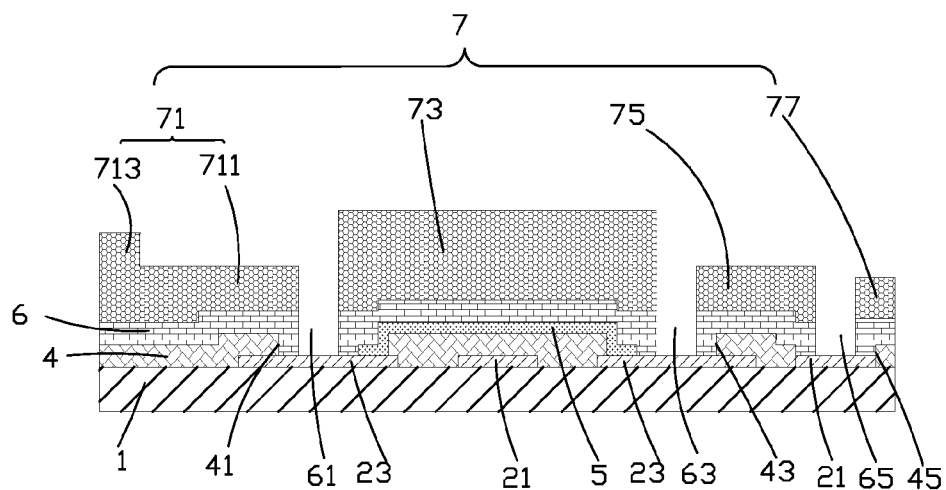
FIG. 11 is a diagram of step 10 in the manufacture method of the TFT substrate according to the present invention.
Figure 12:
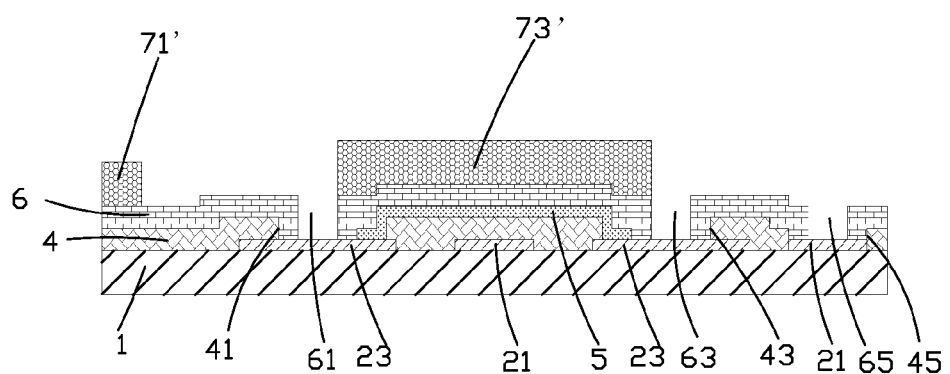
FIG. 12 is a diagram of step 11 in the manufacture method of the TFT substrate according to the present invention.
Figure 13:
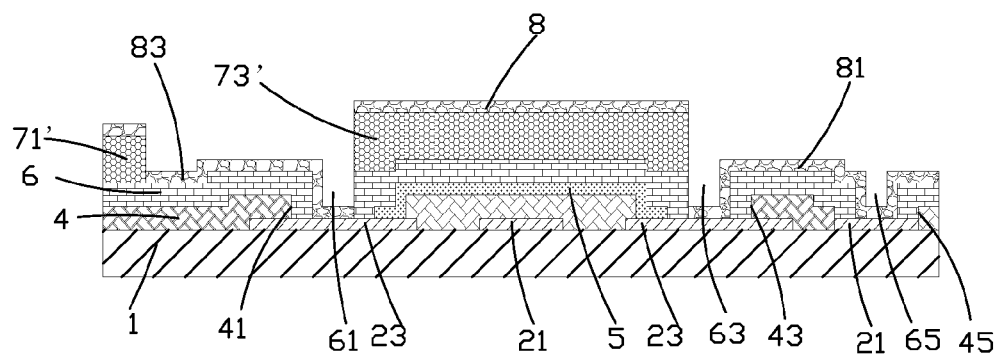
FIG. 13 is a diagram of step 12 in the manufacture method of the TFT substrate according to the present invention.

Specifically, the fourth photoresistor area 71 comprises a main part 711 and an extruding part 713, and a thickness of the extruding part 713 is larger than a thickness of the main part 711, and the thicknesses of the extruding part 713 and the fifth photoresistor area 73 are larger than thicknesses of the sixth photoresistor area 75 and the seventh photoresistor area 77.

step 10, as shown in FIG. 11, removing the protecting layer 6 uncovered by the fourth photoresistor area 71, the fifth photoresistor area 73, the sixth photoresistor area 75 and the seventh photoresistor area 77 to form a first, a second and a third through holes 61, 63, 65 for exposing the gate 21 and the source/the drain 23.

step 11, as shown in FIG. 12, implementing ashing process to the second photoresistor layer 7 with injecting oxygen gas to remove the main part 711 of the fourth photoresistor area 71 and diminishing the thickness of extruding part 713 to reserve a part of the fourth photoresistor area 71'; diminishing the thickness of the fifth photoresistor area 73 to reserve a part of the fifth fourth photoresistor area 73'; removing the sixth photoresistor area 75 and the seventh photoresistor area 77.

step 12, as shown in FIG. 13, deposing a transparent conducting thin film 8 on the part of the fourth photoresistor area 71', the part of the fifth fourth photoresistor area 73', the protecting layer 6, the gate 21, the source/the drain 23.

A part of the transparent conducting thin film 8 is employed as a landing electrode 81 to fill the second and the third through holes 63, 65 for connecting the gate 21 and the source/the drain 23, and a part of the transparent conducting thin film 8 is employed as a pixel electrode 83 to fill the first through hole 61 and connect the source/the drain 23.

The step 6 omits the manufacture of the second metal layer. The part of transparent conducting thin film 8 is utilized as the landing electrodes 81 to connect the gate 21 and the source/the drain 23 to simplify the TFT substrate structure.

Figure 14:
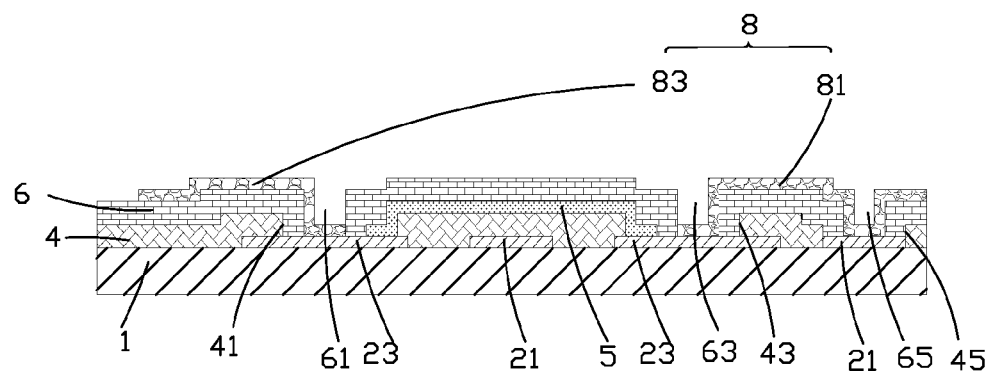
FIG. 14 is a diagram of step 13 in the manufacture method of the TFT substrate according to the present invention.
Figure 15:
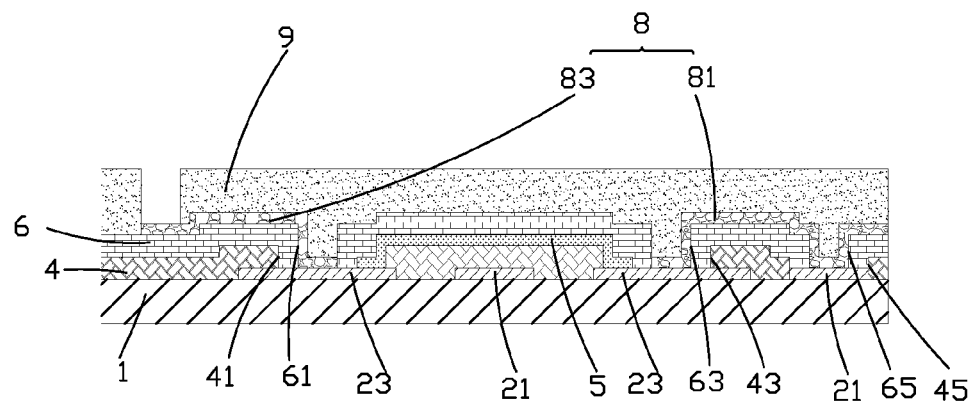
FIG. 15 is a diagram of step 14 in the manufacture method of the TFT substrate according to the present invention.

Specifically, the transparent conducting thin film 8 is an Indium titanium oxide (ITO) transparent conducting thin film or an Indium zinc oxide (IZO) transparent conducting thin film.

step 13, as shown in FIG. 14, by utilizing the thickness differences among the part of the fourth photoresistor area 71', the part of the fifth fourth photoresistor area 73' and the protecting layer 6, removing the part of the fourth photoresistor area 71', the part of the fifth fourth photoresistor area 73' and the transparent conducting thin film 8 deposed on the both, and implementing anneal process by lift-off process.

step 14, as shown in FIG. 15, coating photoresist on the transparent conducting thin film 8 and the protecting layer 6, and implementing exposure and development by a fourth mask to define illuminating display positions and form a pixel definition layer 9.

Figure 16:
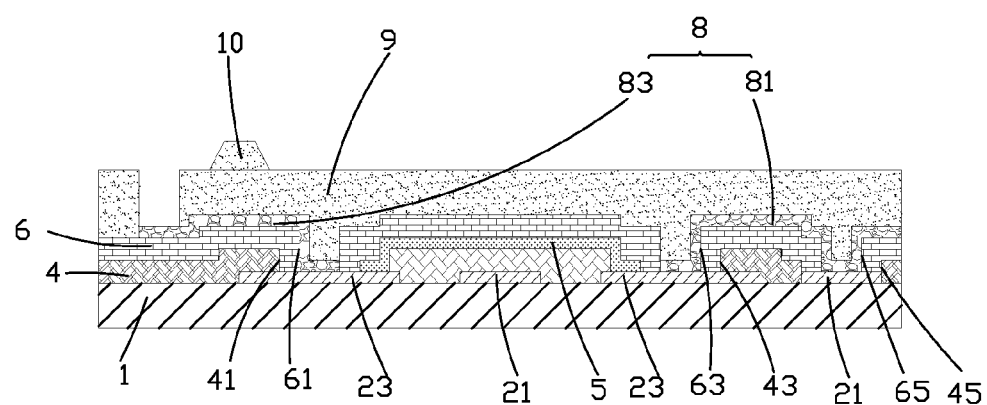
FIG. 16 is a diagram of step 15 in the manufacture method of the TFT substrate and a diagram of a TFT substrate structure.

Specifically, material of the pixel definition layer 9 is organic photoresistor.

step 15, as shown in FIG. 16, coating photoresist on the pixel definition layer 9, and implementing exposure and development by a fifth mask to form photo spacers 10.

Specifically, material of the photo spacers 10 is organic photoresistor.

Please refer to FIG. 16. On the basis of the aforesaid manufacture method of the TFT substrate, the present invention further provides a TFT substrate structure manufactured by the manufacture method of the TFT substrate, comprising: a substrate 1, a gate 21 on the substrate 1, a source/a drain 23 on the substrate 1, an isolation layer 4 on the gate 21 and the source/the drain 23, an oxide semiconductor layer 5 on the isolation layer 4, a protecting layer 6 on the isolation layer 4 and the oxide semiconductor layer 5, a transparent conducting thin film 8 on the protecting layer 6, a pixel definition layer 9 on the transparent conducting thin film 8 and the protecting layer 6 and photo spacers 10 on the pixel definition layer 9.

The gate 21 and the source/the drain 23 are located with in-between spaces, and the isolation layer 4 comprises a first, a second and a third vias 41, 43, 45, and the protecting layer 6 correspondingly comprises a first, a second and a third through holes 61, 63, 65 for exposing the gate 21 and the source/the drain 23, and the oxide semiconductor layer 5 fills a part of the first and the second vias 41, 43, and contacts the source/the drain 23 to form electrical connections; the transparent conducting thin film 8 comprises a landing electrode 81 and a pixel electrode 83, and the landing electrode 81 fills the second and the third through holes 63, 65 for connecting the gate 21 and the source/the drain 23, and the pixel electrode 83 fills the first through hole 61 and connects the source/the drain 23.

Specifically, the oxide semiconductor layer 5 is an Indium gallium zinc oxide (IGZO) oxide semiconductor layer. The transparent conducting thin film 8 is an ITO transparent conducting thin film or an IZO transparent conducting thin film, and material of the pixel definition layer 9 and the photo spacer 10 is organic photoresistor.

In conclusion, according to the manufacture method of the TFT substrate of the present invention, the gate and the source/the drain are formed with the first metal layer. The connections thereof are achieved with the transparent conducting thin film and the TFT substrate structure is simplified; the gray scal exposure skill is employed to implement exposure to the photoresistor, and the manufacture of the TFT substrate is accomplished by five masks. The process procedure is shortened. The manufacture efficiency is raised. The amount of the masks is reduced. The manufacture cost is decreased. The yield of products can be raised. According to the TFT substrate structure, the gate and the source/the drain are formed on the substrate. The connections thereof are achieved with the transparent conducting thin film. It is capable of shortening the process procedure, raising the manufacture efficiency and reducing the manufacture cost.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a TFT substrate, comprising steps of:

step 1, providing a substrate and deposing a first metal layer on the substrate;

step 2, coating a first photoresistor layer on the first metal layer, and implementing gray scal exposure to the first photoresistor layer by a first mask process for patterning the first photoresistor layer to form a first photoresistor area, a second photoresistor area and a third photoresistor area spaced with one another;

step 3, removing the first metal layer uncovered by the first, the second and the third photoresistor areas to form a gate and a source/a drain;

step 4, implementing ashing process to the first, the second and the third photoresistor areas to reserve a part of the first photoresistor area, a part of the second photoresistor area; removing the third photoresistor area; the part of the first photoresistor area and the part of the second photoresistor area respectively correspond to a first, a second and a third vias of an isolation layer to be formed;

step 5, deposing the isolation layer on the substrate, the gate, the source/the drain, the part of the first photoresistor area and the part of the second photoresistor area;

step 6, removing the part of the first photoresistor area, the part of the second photoresistor area and the isolation layer deposed on the both to form the first, the second and the third vias for exposing the gate and the source/the drain;

step 7, deposing an oxide semiconductor thin film on the isolation layer, and a second mask to implement a photolithography process, and implementing etching, patterning and anneal processes to the oxide semiconductor thin film to form an oxide semiconductor layer; the oxide semiconductor layer partially fills the first, the second vias, and contacts the source/the drain to form electrical connections;

step 8, deposing a protecting layer on the oxide semiconductor layer and the isolation layer;

step 9, coating a second photoresistor layer on the protecting layer, and implementing gray scal exposure to the second photoresistor layer by a third mask process for patterning the second photoresistor layer to form a fourth photoresistor area, a fifth photoresistor area, a sixth photoresistor area and a seventh photoresistor area spaced with one another;

step 10, removing the protecting layer uncovered by the fourth photoresistor area, the fifth photoresistor area, the sixth photoresistor area and the seventh photoresistor area to form a first, a second and a third through holes for exposing the gate and the source/the drain;

step 11, implementing ashing process to the second photoresistor layer to reserve a part of the fourth photoresistor area and a part of the fifth fourth photoresistor area; removing the sixth photoresistor area and the seventh photoresistor area;

step 12, deposing a transparent conducting thin film on the part of the fourth photoresistor area, the part of the fifth fourth photoresistor area, the protecting layer, the gate, the source/the drain, and a part of the transparent conducting thin film is employed as a landing electrode to fill the second and the third through holes for connecting the gate and the source/the drain, and a part of the transparent conducting thin film is employed as a pixel electrode to fill the first through hole and connect the source/the drain;

step 13, removing the part of the fourth photoresistor area, the part of the fifth fourth photoresistor area and the transparent conducting thin film deposed on the both, and implementing anneal process;

step 14, coating photoresistor on the transparent conducting thin film and the protecting layer, and implementing exposure and development by a fourth mask to define illuminating display positions and form a pixel definition layer;

step 15, coating photoresistor on the pixel definition layer, and implementing exposure and development by a fifth mask to form photo spacers.

2. The manufacture method of the TFT substrate according to claim 1, wherein in the second step, the first photoresistor area comprises a central part and side parts at two sides of the central part, and a thickness of the central part is larger than a thickness of the two side parts, and a width of a first photoresistor area is larger than widths of the second, the third photoresistor areas, and the thickness of the central part and the thickness of the second photoresistor area are larger than the thickness of the third photoresistor area;

the ashing process in the fourth step comprises removing the two side parts of the first photoresistor area and diminishing the thickness of the central part, and reserving a part of the first photoresistor area; diminishing the thickness of the second photoresistor area, and reserving a part of the second photoresistor area; removing the third photoresistor area.

3. The manufacture method of the TFT substrate according to claim 1, wherein thickness differences among the part of the first photoresistor area, the part of the second photoresistor area and the gate, the source/the drain are utilized in the sixth step to remove the part of the first photoresistor area, the part of the second photoresistor area and the isolation layer deposed on the both by lift-off process.

4. The manufacture method of the TFT substrate according to claim 1, wherein in the seventh step, the oxide semiconductor layer is an IGZO oxide semiconductor layer.

5. The manufacture method of the TFT substrate according to claim 1, wherein in the ninth step, the fourth photoresistor area comprises a main part and an extruding part, and a thickness of the extruding part is larger than a thickness of the main part, and the thicknesses of the extruding part and the fifth photoresistor area are larger than thicknesses of the sixth photoresistor area and the seventh photoresistor area;

the ashing process in the eleventh step comprises removing the main part of the fourth photoresistor area and diminishing the thickness of extruding part, and reserving a part of the fourth photoresistor area; diminishing the thickness of the fifth photoresistor area, and reserving a part of the fifth photoresistor area; removing the sixth photoresistor area and the seventh photoresistor area.

6. The manufacture method of the TFT substrate according to claim 1, wherein in the twelfth step, the transparent conducting thin film is an ITO transparent conducting thin film or an IZO transparent conducting thin film.

7. The manufacture method of the TFT substrate according to claim 1, wherein thickness differences among the part of the fourth photoresistor area, the part of the fifth photoresistor area and the protecting layer are utilized in the thirteenth step to remove the part of the fourth photoresistor area, the part of the fifth photoresistor area and the transparent conducting thin film deposed on the both by lift-off process.

8. The manufacture method of the TFT substrate according to claim 1, wherein in the fourteenth step, the fifteenth step, material of the pixel definition layer, the photo spacer is organic photoresistor.

9. A TFT substrate structure, comprising a substrate, a gate on the substrate, a source/a drain on the substrate, an isolation layer on the gate and the source/the drain, an oxide semiconductor layer on the isolation layer, a protecting layer on the isolation layer and the oxide semiconductor layer, a transparent conducting thin film on the protecting layer, a pixel definition layer on the transparent conducting thin film and the protecting layer and photo spacers on the pixel definition layer; the gate and the source/the drain are located with in-between spaces, and the isolation layer comprises a first, a second and a third vias, and the protecting layer correspondingly comprises a first, a second and a third through holes for exposing the gate and the source/the drain, and the oxide semiconductor layer fills a part of the first and the second vias, and contacts the source/the drain to form electrical connections; the transparent conducting thin film comprises a landing electrode and a pixel electrode, and the landing electrode fills the second and the third through holes for connecting the gate and the source/the drain, and the pixel electrode fills the first through hole and connects the source/the drain.

10. The TFT substrate structure according to claim 9, wherein material of the oxide semiconductor layer is IGZO, and material of the transparent conducting thin film is ITO or IZO, and material of the pixel definition layer and the photo spacer is organic photoresistor.

11. A TFT substrate structure, comprising a substrate, a gate on the substrate, a source/a drain on the substrate, an isolation layer on the gate and the source/the drain, an oxide semiconductor layer on the isolation layer, a protecting layer on the isolation layer and the oxide semiconductor layer, a transparent conducting thin film on the protecting layer, a pixel definition layer on the transparent conducting thin film and the protecting layer and photo spacers on the pixel definition layer; the gate and the source/the drain are located with in-between spaces, and the isolation layer comprises a first, a second and a third vias, and the protecting layer correspondingly comprises a first, a second and a third through holes for exposing the gate and the source/the drain, and the oxide semiconductor layer fills a part of the first and the second vias, and contacts the source/the drain to form electrical connections; the transparent conducting thin film comprises a landing electrode and a pixel electrode, and the landing electrode fills the second and the third through holes for connecting the gate and the source/the drain, and the pixel electrode fills the first through hole and connects the source/the drain;

wherein material of the oxide semiconductor layer is IGZO, and material of the transparent conducting thin film is ITO or IZO, and material of the pixel definition layer and the photo spacer is organic photoresistor.

* * * * *